United States Patent
Trojan et al.

(10) Patent No.: US 9,390,903 B2
(45) Date of Patent: Jul. 12, 2016

(54) METHOD AND APPARATUS FOR WAFER BACKGRINDING AND EDGE TRIMMING ON ONE MACHINE

(71) Applicant: AXUS TECHNOLOGY, LLC, Chandler, AZ (US)

(72) Inventors: Daniel R. Trojan, Phoenix, AZ (US); Richard Ciszek, Phoenix, AZ (US); Clifford Daniel, Tempe, AZ (US)

(73) Assignee: AXUS TECHNOLOGY, LLC, Chandler, AZ (US)

( * ) Notice: Subject to any disclaimer, the term of this patent is extended or adjusted under 35 U.S.C. 154(b) by 263 days.

(21) Appl. No.: 14/022,107

(22) Filed: Sep. 9, 2013

(65) Prior Publication Data

US 2014/0073223 A1    Mar. 13, 2014

Related U.S. Application Data

(60) Provisional application No. 61/697,950, filed on Sep. 7, 2012.

(51) Int. Cl.
*H01L 21/02* (2006.01)
*B24B 27/00* (2006.01)
(Continued)

(52) U.S. Cl.
CPC .......... *H01L 21/02008* (2013.01); *B24B 9/065* (2013.01); *B24B 27/0023* (2013.01); *B24B 27/0069* (2013.01); *B24B 37/107* (2013.01);
(Continued)

(58) Field of Classification Search
CPC ............ B24B 27/0023; B24B 27/0069; B24B 37/107; B24B 37/345; B24B 9/065; H01L 21/02008; H01L 21/02021
See application file for complete search history.

(56) References Cited

U.S. PATENT DOCUMENTS

2002/0098777 A1 * 7/2002 Laursen et al. .................. 451/6
2004/0261944 A1 * 12/2004 Wakabayashi et al. .. 156/345.12
(Continued)

FOREIGN PATENT DOCUMENTS

JP        2007165802 A  *  6/2007
JP        2009038267 A  *  2/2009

OTHER PUBLICATIONS

JP 2009038267A (Feb. 2009)—English Machine Translation.*
Patent Cooperation Treaty, International Search Report and Written Opinion for PCT/US2013/058824, Feb. 11, 2014; pp. 1-8, ISA.

*Primary Examiner* — Joseph J Hail
*Assistant Examiner* — Marc Carlson
(74) *Attorney, Agent, or Firm* — Schmeiser, Olsen & Watts LLP

(57) ABSTRACT

A workpiece processing apparatus is provided. The apparatus includes a rotary turntable having one or more spindles thereon, the turntable being configured to rotate about a turntable axis. Each of the spindles is configured to receive and secure thereon a workpiece to be processed by the apparatus. Each of the spindles can rotate about their own independent axes. The apparatus includes one or more grind spindles that overlay the turntable and are configured to communicate with the workpieces. The apparatus processes the workpieces by transitioning between first and second operational states. The first operational state centers the spindles and the workpieces thereon under the grind spindle to condition an entire top surface of the workpieces. The second operational state offsets the spindles from the center of the grind spindle to condition a perimeter edge of the workpieces. A controller can govern the transition between first and second operational states.

20 Claims, 5 Drawing Sheets

(51) Int. Cl.
*B24B 37/10* (2012.01)
*B24B 37/34* (2012.01)
*B24B 9/06* (2006.01)

(52) U.S. Cl.
CPC ........ *B24B 37/345* (2013.01); *H01L 21/02021* (2013.01)

(56) References Cited

U.S. PATENT DOCUMENTS

| | | | |
|---|---|---|---|
| 2005/0118938 A1* | 6/2005 | Mizomoto et al. | 451/65 |
| 2006/0035563 A1* | 2/2006 | Kalenian et al. | 451/5 |
| 2011/0165823 A1* | 7/2011 | Ide et al. | 451/41 |
| 2012/0202406 A1* | 8/2012 | Trojan et al. | 451/57 |

* cited by examiner

METHOD AND APPARATUS FOR WAFER BACKGRINDING AND EDGE TRIMMING ON ONE MACHINE

CROSS REFERENCE TO RELATED APPLICATION(S)

This application claims priority to U.S. Provisional Patent Application to Trojan et al. entitled "METHOD AND APPARATUS FOR WAFER BACKGRINDING AND EDGE TRIMMING ON ONE MACHINE," Ser. No. 61/697,950, filed Sep. 7, 2012, the disclosure of which is hereby incorporated entirely herein by reference.

BACKGROUND

1. Technical Field

This disclosure relates generally to processing workpieces, such as high-precision wafers and substrates, and in particular to a method and apparatus of processing workpieces more efficiently and cost-effectively on a single machine.

2. State of the Art

Wafer back grinding, also known as wafer thinning, is a semiconductor device fabrication step during which wafer thickness is reduced to allow for stacking and high density packaging of integrated circuits (IC). These integrated circuits are present in many everyday electrical-based and electronic-enabled devices.

The fabrication of semiconductor devices is typically a multiple-step sequence of photographic and chemical processing stages/phases during which electronic circuits are gradually created on a wafer made of semiconducting material. The semiconductor device fabrication process is continually evolving, in most every phase, in an effort to obtain increased efficiencies, cost savings, and size reductions. For example, as electronics applications shrink in size, integrated circuit (IC) packaged devices must be reduced both in footprint and thickness. The main motivation for the development of smaller packages is the demand for portable communications devices, such as memory cards, smart cards, cellular telephones, portable computing and so forth.

Because of its high thinning rate, mechanical grinding currently is the most common technique for wafer thinning. Surface grinding or polishing operations in semiconductor device fabrication can entail both back grinding and face grinding. Wafer back grinding is a process in semiconductor device fabrication in which the backside of a wafer is ground down to the desired wafer thickness prior to assembly. Wafer back grinding can include both coarse grinding and fine grinding techniques to achieve the optimal wafer thickness and performance for the particular application. On the other hand, wafer face grinding is a process in semiconductor device fabrication in which the front or active surface of the wafer is planarized, or flattened, after each layer is formed on the substrate in order to meet exceedingly stringent flatness requirements necessary for small-dimensioned patterning. Back grinding and face grinding operations, collectively referred to herein as surface grinding, have been implemented in various forms on existing machines.

As processed wafers become thinner, conventional thinning processes put wafer edges at high risk of chipping. In particular, a conventional surface grinding process can produce a wafer in which its edge becomes a protruding and unsupported sharp edge of, for example, silicon, with increased likelihood of chipping. However, such chipping along sharp edges may be reduced by trimming the edge of the wafer prior to surface grinding operations in order to remove rough or damaged surfaces from the edge region of a wafer. The benefits of performing an edge trimming process include a reduction in wafer defects, enable direct wafer bonding, and so forth.

Conventionally, surface grinding and edge trimming processes call for separate machines that each provides a separate and specific function—one machine as a surface grinder and another machine as a wafer edge grinder. But, the need to purchase individual machines to realize these separate processes undesirably increases capital equipment costs, uses excessive space, and increases manufacturing complexity through incorporation of additional process steps.

As a result, there is a need in the wafer fabrication industry and market for an apparatus that addresses these concerns.

SUMMARY

The present disclosure relates to processing workpieces, such as high-precision wafers and substrates, and in particular to a method and apparatus of processing workpieces more efficiently and cost-effectively on a single machine.

An aspect of the present disclosure includes a workpiece processing apparatus, the apparatus comprising a rotary turntable configured to rotate about a turntable axis, a spindle on the turntable, the spindle being configured to secure a workpiece thereon, the spindle being configured to rotate about a spindle axis independently of the rotation of the turntable, a grind spindle, the grind spindle being configured to overlay the turntable and functionally engage the workpiece when rotated thereunder, wherein the apparatus is configured to transition between a first operational state and a second operational state, and wherein in the first operational state the turntable is configured in a first position to center the spindle and the workpiece thereon under the grind spindle so that the grind spindle may condition an entire top surface of the workpiece, and wherein in the second operational state the turntable is configured to be offset an offset distance from the first position to offset the spindle and the workpiece thereon from the center of the grind spindle so that the grind spindle may condition a perimeter edge of the workpiece.

Another aspect of the present disclosure includes the apparatus further comprising a first sensor fixed relative to the apparatus and configured to position the turntable in the first position for surface grinding of the workpiece in the first operational state, and a second sensor adjustable relative to the apparatus and configured to rotate about the turntable to adjust and set the offset distance of the turntable from the first position that corresponds to an amount of edge trimming of the workpiece in the second operational state.

Another aspect of the present disclosure includes the apparatus further comprising an unload transfer arm proximate the turntable configured to remove the workpiece from the spindle of the turntable, a load transfer arm proximate the turntable configured to insert a new workpiece on the spindle of the turntable, and a workpiece transfer station, the workpiece transfer station being defined by the spindle on the turntable being temporarily positioned between the unload transfer arm and the load transfer arm, wherein each of the unload transfer arm and the load transfer arm is configured to rotate about a respective axis such that respective ends of the transfer arms create resulting arc paths, the resulting arc paths intersecting at the workpiece transfer station to facilitate removal and insertion of workpieces.

Another aspect of the present disclosure includes wherein in the first operational state the workpiece transfer station is positioned symmetrically between the unload transfer arm and the load transfer arm such that an operational length of each of the unload transfer arm and the load transfer arm is fixed along respective arc paths, and wherein in the second operational state the workpiece transfer station is positioned asymmetrically between the unload transfer arm and the load transfer arm such that an operational length of each of the unload transfer arm and the load transfer arm is independently adjustable along respective arc paths to account for the asymmetric position of the workpiece transfer station.

Another aspect of the present disclosure includes the apparatus further comprising an unload transfer arm sensor configured to sense a position of the unload transfer arm, wherein under the condition the apparatus is in the second operational state and the unload transfer arm rotates toward the workpiece transfer station and passes a predetermined point along the arc path, the unload transfer arm sensor instructs the unload transfer arm to extend its length a predetermined distance that corresponds to the offset distance to permit the end of the unload transfer arm to reach the workpiece transfer station, and wherein under the condition the apparatus is in the second operational state and the unload transfer arm rotates away from the workpiece transfer station and passes back over the predetermined point along the arc path, the unload transfer arm sensor instructs the unload transfer arm to retract its extended length, and a load transfer arm sensor configured to sense a position of the load transfer arm, wherein under the condition the apparatus is in the second operational state and the load transfer arm rotates toward the workpiece transfer station and passes a predetermined point along the arc path, the load transfer arm sensor instructs the load transfer arm to extend its length a predetermined distance that corresponds to the offset distance to permit the end of the load transfer arm to reach the workpiece transfer station, and wherein under the condition the apparatus is in the second operational state and the load transfer arm rotates away from the workpiece transfer station and passes back over the predetermined point along the arc path, the load transfer arm sensor instructs the load transfer arm to retract its extended length.

Another aspect of the present disclosure includes the apparatus further comprising an edge trimming gauge proximate the turntable and configured to measure and monitor an amount of edge trim being applied by the grind spindle to the perimeter edge of the workpiece during edge trimming.

Another aspect of the present disclosure includes the apparatus further comprising a plurality of spindles on a perimeter of the turntable, each of the spindles being configured to secure a workpiece thereon and spaced apart a circumferential distance from one another, and a plurality of grind spindles configured to overlay the turntable and functionally engage the workpieces when rotated thereunder by the intermittent rotary movement of the turntable, wherein in the first operational state the turntable is in the first position and is configured to intermittently rotate the circumferential distance to sequentially center a spindle of the plurality of spindles under each of the plurality of grind spindles to permit the grind spindles to condition entire top surfaces of the respective workpieces sequentially centered thereunder, and wherein in the second operational state the turntable is configured to be offset an offset distance from the first position such that as the turntable intermittently rotates the circumferential distance the spindles are offset from the grind spindles to permit one of the plurality of grind spindles to condition a perimeter edge of one of the workpieces as the workpieces are sequentially rotated thereunder.

Another aspect of the present disclosure includes a system for enabling a workpiece surface grinding apparatus to perform surface grinding and edge trimming of workpieces, the system comprising a rotary turntable configured on the apparatus to rotate about a turntable axis, the turntable having a home position corresponding to a surface grinding configuration, a plurality of spindles on a perimeter of the turntable, each of the spindles being spaced apart a circumferential distance from one another and configured to secure a workpiece thereon, and a plurality of grind spindles configured to overlay the turntable and functionally engage the workpieces when rotated thereunder by the intermittent rotary movement of the turntable, a sensor on the apparatus that positions the turntable, the sensor being configured to rotate an offset distance circumferentially about the turntable to reposition the home position of the turntable to an edge trimming position for an edge trimming configuration, the offset distance relating to an amount of edge trim to be applied to the workpieces, and a controller in communication with the apparatus to selectively direct the apparatus to operate in the edge trimming configuration.

Another aspect of the present disclosure includes the system further comprising an unload transfer arm proximate the turntable configured to remove processed workpieces from the spindles of the turntable, a load transfer arm proximate the turntable configured to insert new workpieces on the spindles of the turntable, and a workpiece transfer station, the workpiece transfer station being defined by a spindle on the turntable temporarily positioned between the unload transfer arm and the load transfer arm, wherein each of the unload transfer arm and the load transfer arm are configured to rotate about a respective axis such that respective ends of the transfer arms create resulting arc paths, the resulting arc paths intersecting at the workpiece transfer station to facilitate removal and insertion of workpieces, wherein in the surface grinding configuration the home position of the turntable positions the workpiece transfer station symmetrically between the unload transfer arm and the load transfer arm, such that an operational length of each of the unload transfer arm and the load transfer arm is fixed along respective arc paths that intersect at the workpiece transfer station, and wherein in the edge trimming configuration the offset position of the turntable positions the workpiece transfer station asymmetrically between the unload transfer arm and the load transfer arm, and the controller controls an operational length of each of the unload transfer arm and the load transfer arm to independently adjust to account for the asymmetric position of the workpiece transfer station.

Another aspect of the present disclosure includes the system further comprising an unload transfer arm sensor in functional communication with the unload transfer arm to sense a position of the unload transfer arm, wherein in the surface grinding configuration the controller deactivates the unload transfer arm sensor, and wherein in the edge trimming configuration the controller activates the unload transfer arm sensor, and a load transfer arm sensor in functional communication with the load transfer arm to sense a position of the load transfer arm, wherein in the surface grinding configuration the controller deactivates the load transfer arm sensor, and wherein in the edge trimming configuration the controller activates the unload transfer arm sensor.

Another aspect of the present disclosure includes wherein under the condition the unload transfer arm sensor is active and the unload transfer arm rotates toward the workpiece transfer station and passes a predetermined point along its arc path, the controller instructs the unload transfer arm to extend its length a predetermined distance that correlates to the offset distance to permit the end of the unload transfer arm to reach the workpiece transfer station, and wherein under the condition the unload transfer arm rotates away from the workpiece transfer station and passes back over the predetermined point along the arc path, the controller instructs the unload transfer arm to retract its extended length, and wherein under the condition the load transfer arm sensor is active and the load transfer arm rotates toward the workpiece transfer station and passes a predetermined point along its arc path, the load transfer arm sensor instructs the load transfer arm to extend its length a predetermined distance that corresponds to the offset distance to permit the end of the load transfer arm to reach the workpiece transfer station, and wherein under the condition the load transfer arm rotates away from the workpiece transfer station and passes back over the predetermined point along the arc path, the load transfer arm sensor instructs the load transfer arm to retract its extended length.

Another aspect of the present disclosure includes a method for processing workpieces on a surface grinding apparatus configured to additionally perform edge trimming, the method comprising inserting a workpiece on at least one of a plurality of spindles on a turntable of the apparatus, adjusting the turntable a selected offset distance to offset the plurality of spindles from grind spindles overlaying the turntable, rotating the turntable to bring the workpiece in proximity to one of the grind spindles such that the grind spindle partially overlays the workpiece due to the offset distance, trimming an edge of the workpiece with the one of the grind spindles, and removing the workpiece from the turntable.

Another aspect of the present disclosure includes wherein the step of inserting the workpiece further comprises rotating a load transfer arm toward a workpiece, picking up the workpiece with the load transfer arm rotating the load transfer arm toward the turntable extending a length of the load transfer arm a predetermined distance that correlates with the selected offset distance to position the workpiece over the at least one of a plurality of spindles releasing the workpiece from the load transfer arm rotating the load transfer arm away from the turntable, and retracting the load transfer arm the predetermined distance.

Another aspect of the present disclosure includes wherein the step of removing the workpiece further comprises rotating an unload transfer arm toward a processed workpiece on the at least one of a plurality of spindles, extending a length of the unload transfer arm a predetermined distance that correlates with the selected offset distance to position the unload transfer arm over the processed workpiece, picking up the processed workpiece with the unload transfer arm, rotating the unload transfer arm away from the turntable, retracting the load transfer arm the predetermined distance, and releasing the processed workpiece from the unload transfer arm.

Another aspect of the present disclosure includes wherein the step of adjusting the turntable further comprises moving a home positioning sensor circumferentially about the turntable to reconfigure a home position of the turntable for edge trimming.

Another aspect of the present disclosure includes the operations and control of the apparatus being accomplished by software, such that the turntable can be rotated clockwise and counterclockwise to position the spindles at appropriate positions with respect to the apparatus to load, process, and unload workpieces, as described herein.

The foregoing and other features, advantages, and construction of the present disclosure will be more readily apparent and fully appreciated from the following more detailed description of the particular embodiments, taken in conjunction with the accompanying drawings.

BRIEF DESCRIPTION OF THE DRAWINGS

Some of the embodiments will be described in detail, with reference to the following figures, wherein like designations denote like members.

DETAILED DESCRIPTION OF EMBODIMENTS

A detailed description of the hereinafter described embodiments of the disclosed apparatus and method are presented herein by way of exemplification and not limitation with reference to the Figures listed above. Although certain embodiments are shown and described in detail, it should be understood that various changes and modifications may be made without departing from the scope of the appended claims. The scope of the present disclosure will in no way be limited to the number of constituting components, the materials thereof, the shapes thereof, the relative arrangement thereof, etc., and are disclosed simply as an example of embodiments of the present disclosure.

As a preface to the detailed description, it should be noted that, as used in this specification and the appended claims, the singular forms "a", "an" and "the" include plural referents, unless the context clearly dictates otherwise.

Figure 1:
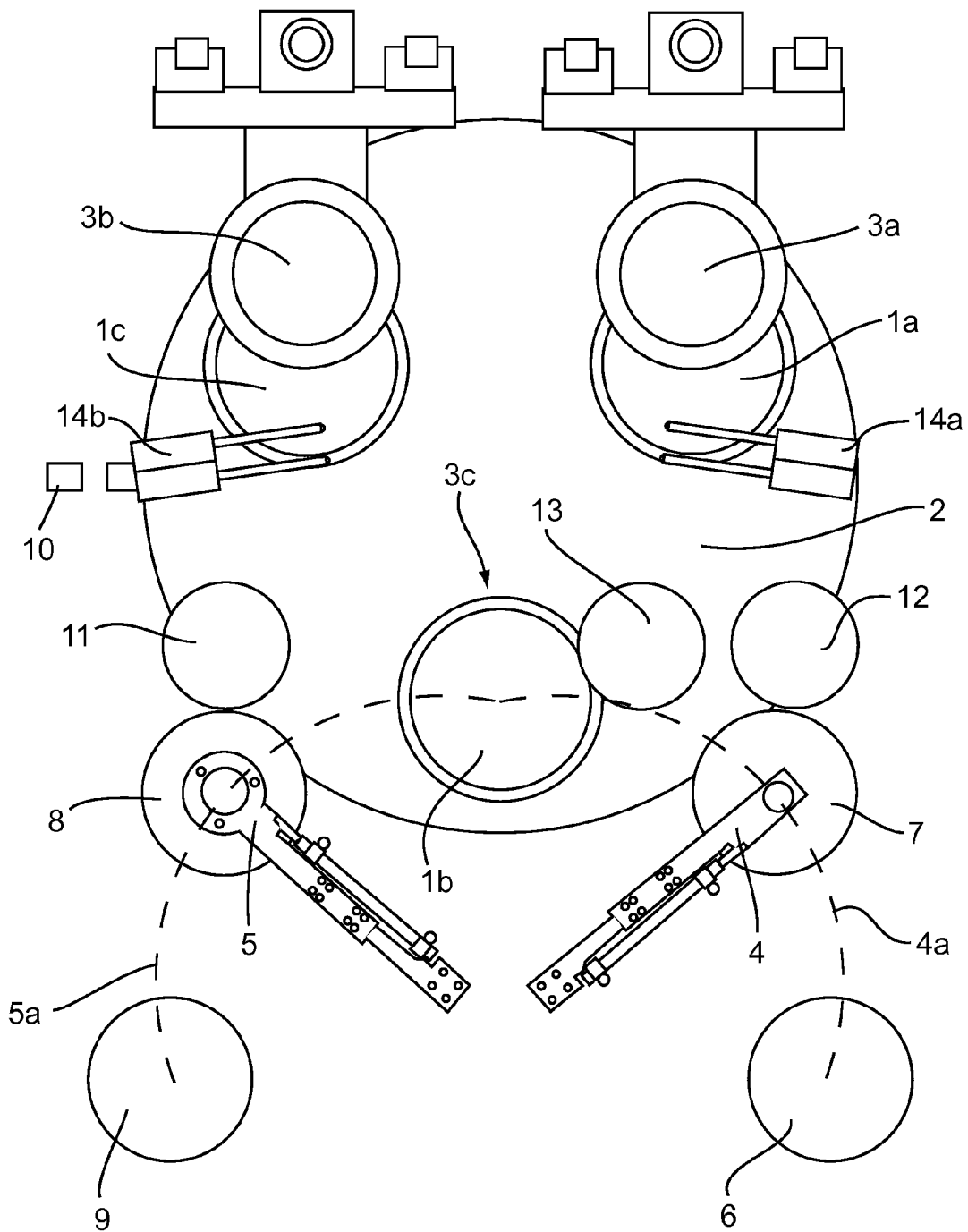
FIG. 1 is a top view of a conventional apparatus for surface grinding of workpieces.

Referring to the drawings, FIG. 1 depicts a conventional apparatus 20 for surface grinding of workpieces. Conventional surface grinding apparatus 20 may be utilized to perform back grinding and/or face grinding on workpieces such as semiconductor and high-precision wafers and substrates including, for example, silicon, gallium arsenide, silicon carbide, sapphire, quartz, fused silica, glass, layered silicon-insulator-silicon substrate, and so forth.

Conventional surface grinding apparatus 20 is adapted to process one or more workpieces, concurrently or separately, as desired. Conventional surface grinding apparatus 20 includes a rotary turntable 2 on which a first spindle 1a, a second spindle 1b, and a third spindle 1c are configured. First, second and third spindles 1a, 1b and 1c may also be referred to as wafer spindles, wafer chucks, wafer holding chucks, or simply chucks. Each of first, second and third spindles 1a, 1b and 1c, respectively, is capable of holding a workpiece for the purpose of performing surface grinding on the workpiece. Each of first, second and third spindles 1a, 1b and 1c, respectively, is capable of applying a vacuum force to secure a workpiece thereon. Each of first, second and third spindles 1a, 1b and 1c, respectively, is capable of spinning about its own individual axis, thus facilitating the axial rotation of the associated workpiece placed on the respective spindle 1a, 1b and 1c so as to facilitate the surface grinding procedure on the workpiece. Each of first, second and third spindles 1a, 1b and 1c, is positioned an equal distance apart from one another about an outer circumference of turntable 2.

Turntable 2 is configured to rotate or spin about its individual axis, independent of the respective individual axes of spindles 1a, 1b and 1c. By so doing, turntable 2 is capable of rotating respective spindles 1a, 1b and 1c about the periphery of turntable 2 to position each of spindles 1a, 1b and 1c with respect to one of a first grind spindle 3a, a second grind spindle 3b, and/or a load/unload workpiece transfer station 3c, in accordance with the operation of the apparatus 20. First and second grind spindles 3a and 3b include grinding wheels, respectively. The grinding wheels may be coarse grinding wheels or fine grinding wheels that are configured to grind workpieces to a reduced thickness. Load/unload workpiece transfer station 3c may be positioned and centered at the intersection of the point of intersection between the rotational paths of unload transfer arm 5 and load transfer arm 4, as depicted in FIG. 1.

As determined by operational aspects of conventional apparatus 20, turntable 2 is capable of properly positioning spindles 1a, 1b and 1c in functional communication with first grind spindle 3a, second grind spindle 3b, or load/unload workpiece transfer station 3c to properly process the workpieces. For example, the respective spacing between each of first, second and third spindles 1a, 1b and 1c, as well as the rotational capability of turntable 2 allows turntable 2 to spin, rotate, or otherwise move, to concurrently position a first of spindles 1a, 1b and 1c in functional communication with first grind spindle 1a, a second of spindles 1a, 1b and 1c in functional communication with second grind spindle 1b, and a third of spindles 1a, 1b and 1c in functional communication with load/unload workpiece transfer station 3c. Also, first and second grind spindles 3a and 3b may be capable of linearly transitioning over the position of the spindles 1a, 1b or 1c on the turntable 2 so as to be appropriately centered above and over respective spindles 1a, 1b or 1c on the turntable 2. Alternatively, first and second grind spindles 3a and 3b may be fixedly positioned over the spindles 1a, 1b or 1c on the turntable 2, and for simplicity of illustration and ease of explanation herein may be shown slightly offset from the spindles 1a, 1b or 1c on the turntable 2, as seen in FIG. 1. Further in the alternative, first and second grind spindles 3a and 3b may be adjustable so as to permit centering of the grinding wheels over the spindles 1a, 1b or 1c on the turntable 2 and to facilitate the easy replacement, exchange, or removal of the grinding wheels, as needed.

A turntable home position sensor 10 configured on conventional apparatus 20 proximate turntable 2 can sense the rotational position of turntable 2 and provide feedback to apparatus 20 to assist apparatus 20 in correctly positioning turntable 2 to accurately position spindles 1a, 1b and 1c with respect to first grind spindle 3a, second grind spindle 3b, and/or load/unload workpiece transfer station 3c. Home position sensor 10 can calibrate and set the "home" location of turntable 2 with respect to the apparatus 20 for surface grinding and conditioning of workpieces. This "home" position for surface grinding and conditioning of workpieces can be a first position of the first operational state of the apparatus 20, the first position being that of surface grinding. In this way, sensor 10 can establish the position of spindles 1a, 1b and 1c so that the apparatus 20 can position two of the three spindles 1a, 1b and 1c to be centered under first and second grind spindles 3a and 3b, and the remaining third spindle to be centered on load/unload workpiece transfer station 3c, which is symmetrically positioned between workpiece load transfer arm 4 and workpiece unload transfer arm 5, to be discussed in greater detail herein. At any rate, with the remaining third spindle being positioned symmetrically between workpiece load transfer arm 4 and workpiece unload transfer arm 5, the remaining third spindle can facilitate both unloading of processed workpieces from turntable 2 and loading of to-be-processed workpieces onto the turntable 2, while at the same time permitting first and second grind spindles 3a and 3b to concurrently perform surface grinding on workpieces positioned thereunder.

For example, if spindle 1a and spindle 1c have workpieces placed thereon and are being processed by first and second grind spindles 3a and 3b, respectively, spindle 1b can facilitate unloading and loading of workpieces therefrom. Thereafter, once the workpieces on spindles 1a and 1c have been ground to a satisfactory thinness by first and second grind spindles 3a and 3b, respectively, and a processed workpiece has been removed from spindle 1b and a to-be-processed workpiece is newly inserted onto spindle 1b, turntable 2 may axially rotate, spin, or otherwise move in a circular direction, to rotate the spindles 1a, 1b and 1c such that spindles 1c and 1b can now be processed by first and second grind spindles 3a and 3b, respectively, and spindle 1a can facilitate unloading of the processed workpiece and loading of a to-be-processed workpiece therefrom. Likewise, once the workpieces on spindles 1c and 1b have been ground to a satisfactory thinness by first and second grind spindles 3a and 3b, respectively, and a processed workpiece has been removed from spindle 1a and a to-be-processed workpiece is newly inserted onto spindle 1a, turntable 2 may axially rotate, spin, or otherwise move in a circular direction, to rotate the spindles 1a, 1b and 1c such that spindles 1b and 1a can now be processed by first and second grind spindles 3a and 3b, respectively, and spindle 1c can facilitate unloading of the processed workpiece and loading of a to-be-processed workpiece therefrom. Such a pattern may be repeated until a satisfactory number of workpieces have been processed. Moreover, turntable 2 may be configured to rotate in either or both of a clockwise or a counter-clockwise direction of rotation. Accordingly, the sequential interaction of spindles 1a, 1b and 1c with grinding spindles 3a and 3b, as well as with load/unload workpiece transfer station 3c, would be adjusted as necessary.

As suggested in the discussion above, the thinness of the each of the workpieces being processed can be monitored and measured. Specifically, the thinness of each of the workpieces can be monitored and measured in situ by either of height gauge 14a configured proximate grinding spindle 3a or height gauge 14b configured proximate grinding spindle 3b. Each of the height gauges 14a and 14b can be a dual probe measurement device, one probe configured to measure the height of the top of the respective spindle 1a, 1b or 1c, and the other probe configured to measure the top of the workpiece positioned on the respective spindle 1a, 1b or 1c. The difference between the respective measurements made by each probe of the respective dual probe height gauges 14a and 14b is the thinness of the respective workpiece being processed.

Coolant nozzles (not depicted) can be positioned proximate each of first grind spindle 3a and second grind spindle 3b to direct water onto respective grinding wheels and/or workpieces during grinding to reduce heat and friction that might otherwise hinder or negatively influence the grinding process.

Conventional surface grinding apparatus 20 may be configured to perform a two-step grinding process and workpiece removal and replacement process. For example, and not in any way limiting, surface grinding apparatus 20 may be capable of carrying out either coarse or fine grinding on respective workpieces under grinding spindle 3a and grinding spindle 3b. Surface grinding apparatus 20 may also be capable of removing processed workpieces and inserting to-be-processed workpieces in its place. To that end, grinding spindle 3a may be a coarse grinding wheel and grinding spindle 3b may be a fine grinding wheel. Alternatively, each of grinding spindle 3a and grinding spindle 3b may be a coarse or fine grinding wheel, as determined by the specific process to be performed. In addition, a sequence of grinding operations can include adjusting grinding spindle 3a and grinding spindle 3b so that grinding spindle 3b is idle and grinding spindle 3a performs coarse grinding on the surface of a respective workpiece when present, while workpiece loading and unloading arms 4 and 5, respectively, may insert or remove a workpiece, as needed. Also, grinding spindle 3a and grinding spindle 3b can be adjusted so grinding spindle 3a and grinding spindle 3b each perform grinding on the surface of respective workpieces, concurrently, when present, while workpiece loading and unloading arms 4 and 5, respectively, may insert or remove a workpiece, as needed. In this configuration, grinding spindle 3a can perform coarse grinding and grinding spindle 3b can perform fine grinding, or vice versa, as the case may be. Also, grinding spindle 3a and grinding spindle 3b can be adjusted so that grinding spindle 3b performs fine grinding on the surface of a respective workpiece, when present, and grinding spindle 3a is idle, while workpiece loading and unloading arms 4 and 5, respectively, may insert or remove a workpiece, as needed. In most cases, each of grinding spindle 3a and grinding spindle 3b will concurrently perform grinding on the surface of respective workpieces because each of grinding spindle 3a and grinding spindle 3b will have a workpiece thereunder, as explained above with respect to spindles 1a, 1b and 1c. Loading and unloading arms 4 and 5, respectively, may insert or remove a workpiece, as needed, to facilitate the continual processing of workpieces under grinding spindle 3a and grinding spindle 3b, as mentioned above and will described in greater detail herein.

To unload a processed workpiece, workpiece unload transfer arm 5 and workpiece cleaning brush 11 may be utilized. After a workpiece has undergone surface grinding, according to the discussion above, but prior to removal of the workpiece from its associated spindle 1a, 1b, or 1c, workpiece cleaning brush 11 may be moved, or otherwise transitioned, laterally over load/unload workpiece transfer station 3c, in which the processed workpiece and associated spindle are positioned, so that cleaning brush 11 is centered over the processed workpiece. In this configuration, cleaning brush 11 is capable of lowering onto the processed workpiece to clean the processed workpiece and remove debris therefrom. Cleaning brush 11 is capable of cleaning the processed workpiece as the processed workpiece spins or rotates under cleaning brush 11 on the associated spindle 1a, 1b, or 1c. After the specified cleaning period, cleaning brush 11 is raised off of the processed workpiece and cleaning brush 11 transitions back to its original, parked position, out of the way of the other operations of the apparatus 20. At this point, the processed workpiece is ready for removal from its associated spindle 1a, 1b or 1c. To do so, workpiece unload transfer arm 5 rotates, or otherwise spins about an axis, from a parked position 8 to a position over the processed workpiece that is positioned in the load/unload workpiece transfer station 3c.

Once centered over the processed workpiece in the load/unload workpiece transfer station 3c, unload transfer arm 5 is lowered onto the processed workpiece so that a vacuum cup configured on unload transfer arm 5 is positioned over the processed workpiece and in proximity to the processed workpiece. A vacuum force is applied from unload transfer arm 5 to the processed workpiece, such that unload transfer arm 5 functionally engages the processed workpiece. Once unload transfer arm 5 determines it has engaged the processed workpiece by vacuum force, the opposing vacuum force of the associated spindle 1a, 1b or 1c is disabled to allow unload transfer arm 5 to lift the processed workpiece off of the spindle 1a, 1b or 1c. With the processed workpiece coupled thereto, unload transfer arm 5 rotates back through its parked position 8 to a spinner table 9, upon which the unload transfer arm 5 places the processed workpiece. Once spinner table 9 determines it has the process workpiece secured, the vacuum force from unload transfer arm 5 is disabled, leaving the processed workpiece on the spinner table 9. Unload transfer arm 5 thereafter rotates back to parked position 8 to await further instruction. Dashed lines indicate the path 5a traveled by the unload transfer arm 5 in the performance of its function.

To load a new, or to-be-processed, workpiece on a spindle 1a, 1b, or 1c, workpiece load transfer arm 4, spindle cleaning brush 12, and spindle dresser 13 may be utilized. After a processed workpiece has been removed from a spindle 1a, 1b, or 1c, as described above, a new workpiece may be inserted thereon. Or, in the alternative, in the event an empty spindle 1a, 1b, or 1c is present, for example at the time of initial startup of the apparatus 20, a new workpiece may be inserted thereon. However, prior to a new workpiece being placed on empty spindle 1a, 1b, or 1c, empty spindle 1a, 1b, or 1c may need to be cleaned and/or prepared.

Spindle cleaning brush 12 and spindle dresser 13 can be utilized to perform the cleaning and preparation of empty spindle 1a, 1b, or 1c for reception of the new workpiece. Either of spindle cleaning brush 12 or spindle dresser 13 is capable of being moved, or otherwise transitioned, laterally over load/unload workpiece transfer station 3c, in which the empty spindle 1a, 1b, or 1c is positioned, so that spindle cleaning brush 12 or spindle dresser 13 is centered over the empty spindle 1a, 1b, or 1c and ready to perform its designated task. In this configuration, spindle cleaning brush 12 is capable of lowering onto empty spindle 1a, 1b, or 1c to clean empty spindle 1a, 1b, or 1c and remove debris therefrom. Spindle cleaning brush 12 is capable of cleaning empty spindle 1a, 1b, or 1c as spindle 1a, 1b, or 1c rotates on its axis. After the specified cleaning period, spindle cleaning brush 12 is raised off of empty spindle 1a, 1b, or 1c and spindle cleaning brush 12 transitions back to its original, parked position, out of the way of the other operations of the apparatus 20. Likewise, in this configuration, spindle dresser 13 is capable of lowering onto empty spindle 1a, 1b, or 1c to dress empty spindle 1a, 1b, or 1c and prepare empty spindle 1a, 1b, or 1c for receiving the new workpiece. Spindle dresser 13 is capable of dressing/preparing empty spindle 1a, 1b, or 1c as spindle 1a, 1b, or 1c rotates on its axis. After the specified cleaning period, spindle dresser 13 is raised off of empty spindle 1a, 1b, or 1c and spindle dresser 13 transitions back to its original, parked position, out of the way of the other operations of the apparatus 20. Spindle dresser 13 typically operates sequentially after operation of spindle cleaning brush 12.

At this point, the new workpiece is ready to be inserted onto empty spindle 1a, 1b or 1c. To do so, workpiece load transfer arm 4 rotates, or otherwise spins about an axis, from a parked position 7 to a workpiece positioning table 6 that holds new workpieces to be processed. Once centered over the workpiece positioning table 6, load transfer arm 4 is lowered onto the new workpiece so that a vacuum cup configured on load transfer arm 4 is positioned over the new workpiece and in proximity to the new workpiece. A vacuum force is applied from load transfer arm 4 to the new workpiece, such that load transfer arm 4 functionally engages the new workpiece. Once load transfer arm 4 determines it has engaged the new workpiece by vacuum force, load transfer arm 4 lifts the new workpiece off of workpiece positioning table 6. With the new workpiece coupled thereto, load transfer arm 4 rotates back to its parked position 7. At parked position 7, a workpiece washing station 7a can wash the new workpiece prior to the new workpiece being inserted onto empty spindle 1a, 1b or 1c. Once washed, load transfer arm 4 rotates to load/unload workpiece transfer station 3c, where empty spindle 1a, 1b or 1c is positioned. Once centered over empty spindle 1a, 1b or 1c, load transfer arm 4 lowers the new workpiece onto empty spindle 1a, 1b or 1c. After the new workpiece is positioned on spindle 1a, 1b or 1c, spindle 1a, 1b or 1c applies vacuum force to the new workpiece to secure the new workpiece thereon. Once spindle 1a, 1b or 1c determines it has the new workpiece secured, the opposing vacuum force from load transfer arm 4 is disabled, leaving the new workpiece on spindle 1a, 1b or 1c. Load transfer arm 4 thereafter rotates back to parked position 7 to await further instruction. Dashed lines indicate the path 4a traveled by the load transfer arm 4 in the performance of its function.

Surface grinding apparatus 20 may therefore achieve increased efficiency of grinding over devices with single grind wheels and single grind chucks. However, an even greater increase in wafer conditioning efficiency can lower the cost of semiconductor devices through decreases in manufacturing costs and equipment costs.

As mentioned above, fragile edges may be created by surface grinding and these fragile edges can chip if not treated. Trimming the edge of the wafer prior to surface grinding operations can help remove rough or damaged surfaces from the edge region of a wafer. The benefits of performing an edge trimming process include a reduction in wafer defects, enable direct wafer bonding, and so forth.

Figure 2:
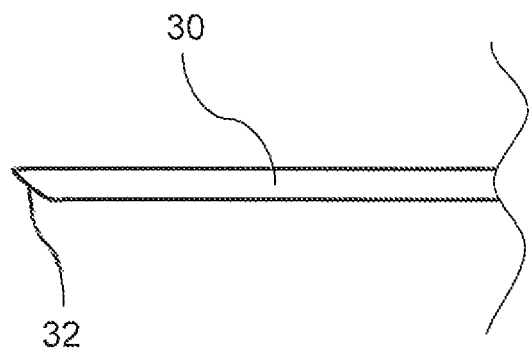
FIG. 2 is a partial side view of a workpiece having been processed by surface grinding in accordance with the present disclosure.
Figure 3:
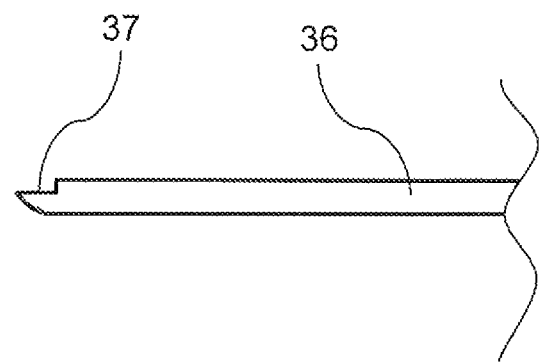
FIG. 3 is a partial side view of a workpiece having been processed by edge trimming and surface grinding in accordance with the present disclosure.

With reference now to FIGS. 2 and 3, FIG. 2 depicts a workpiece 30 has undergone surface grinding without performing an edge trimming process. When a workpiece 30 undergoes surface grinding without edge trimming, an undesirably sharp and fragile edge 32 may be created. Chipping, cracking, and other deformations can occur along these fragile edges 32. FIG. 3 depicts a partial side view of a workpiece 36 that has undergone edge trimming. When the edge of workpiece 36 is edge trimmed before surface grinding, a desirable stepped edge 37 is produced. Stepped edges 37 are generally more resistant to breaking and chipping than fragile edges 32. The benefits of performing an edge trimming process include a reduction in wafer defects, enable direct wafer bonding, and so forth.

Typically, surface grinding and edge trimming calls for two separate machines, a surface grinder and a wafer edge grinder, which undesirably increases capital equipment costs, uses excessive space, and increases manufacturing complexity through incorporation of additional process steps.

Figure 4:
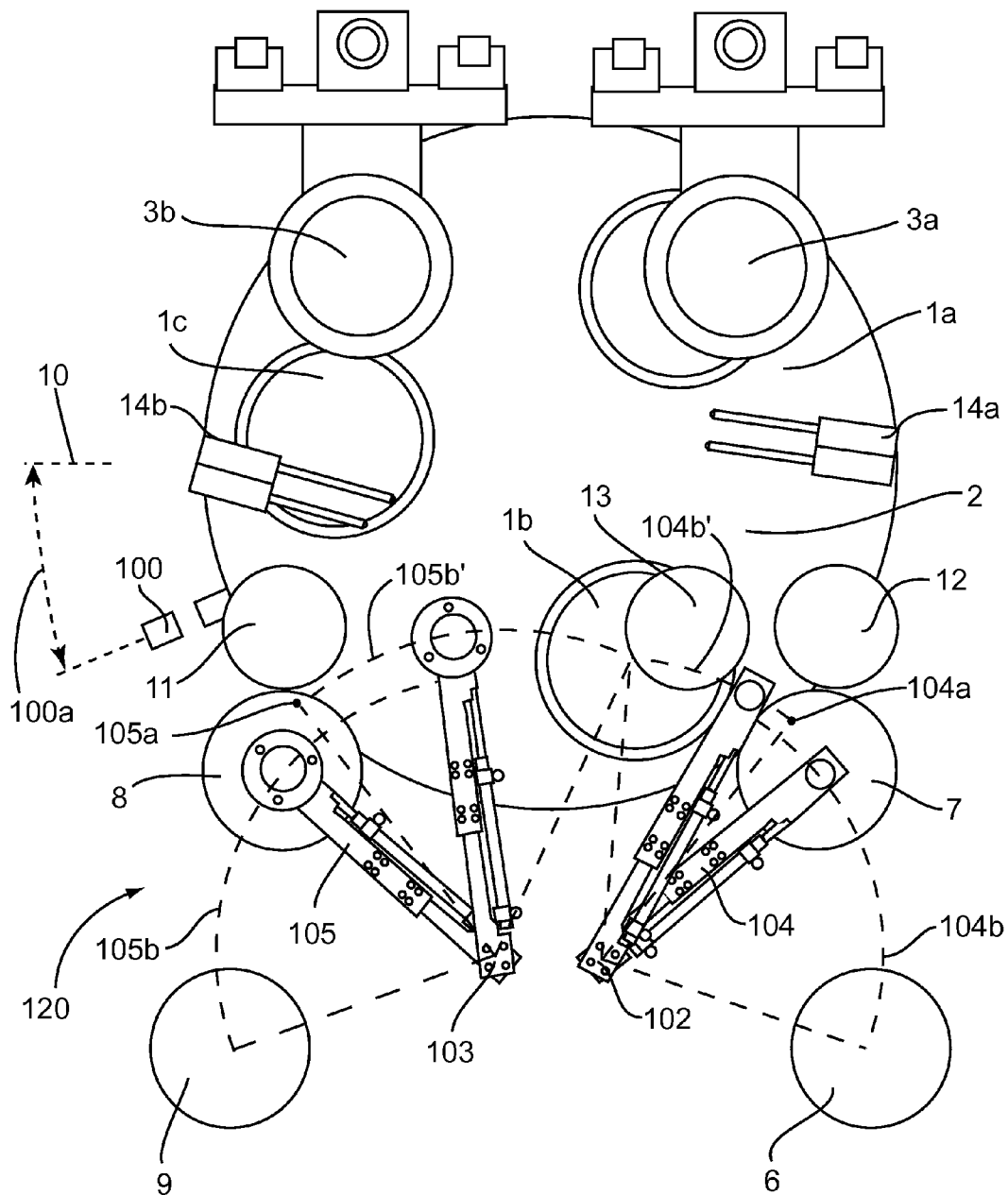
FIG. 4 is a top view of an embodiment of an apparatus for surface grinding and edge trimming of workpieces in accordance with the present disclosure.

Referring now to FIG. 4, an embodiment of a workpiece processing apparatus 120 disclosed herein comprises an apparatus for concurrently processing one or more workpieces (i.e., wafers), in which the apparatus 120 can perform both surface grinding and edge trimming operations on the workpieces. Another embodiment comprises a system for enabling a surface grinding apparatus 120 to perform edge trimming, and still another embodiment comprises a method for concurrently processing two workpieces using a surface grinding apparatus 120 adapted to additionally perform edge trimming. Advantages of the disclosed embodiments include lower capital equipment costs, less manufacturing facility space requirements, fewer process consumables, and so forth.

Workpiece processing apparatus 120 is capable of performing both surface grinding and edge trimming on workpieces placed on spindles 1a, 1b and 1c, respectively, of turntable 2. The term "workpiece", "workpieces" and the like refer to existing and upcoming semiconductor and high-precision wafers and substrates including, for example, silicon, gallium arsenide, silicon carbide, sapphire, quartz, fused silica, glass, layered silicon-insulator-silicon substrate, and so forth.

Embodiments of apparatus 120 include adaptations of many of the components and function of conventional surface grinding apparatus 20 (depicted in FIG. 1 and described herein in accordance therewith), with embodiments of apparatus 120 being adapted to perform the functions of apparatus 20 and additionally perform edge trimming, as disclosed herein. Accordingly, the features and elements implemented to adapt surface grinding apparatus 20 to perform both surface grinding and edge trimming are collectively referred to herein as a system 203 for enabling a surface grinding apparatus 20 to additionally perform edge trimming. The elements and features of surface grinding apparatus 20 (FIG. 1) that are largely unmodified retain their original reference numerals in the ensuing description, and elements and features that form system 203 will be identified as such herein.

In addition to the above, although apparatus 120 is disclosed herein as being modified from a pre-existing surface grinding apparatus, such as apparatus 20 (FIG. 1), it should be understood that apparatus 120 need not be a modification of an existing device, but could instead be an original design that includes the combined features of surface grinding and edge trimming in an apparatus capable of concurrently conditioning a plurality of workpieces. For example, and not by way of limitation, apparatus 120 may be configured to perform surface grinding of workpieces in addition to edge trimming of workpieces. In other words, apparatus 120 may be configured to perform edge trimming on a workpiece and thereafter perform surface grinding of the same workpiece. Thus, apparatus 120 may process an individual workpiece by edge trimming and surface grinding. Apparatus 120 may be configured to individually process a plurality of workpieces one at a time by processing a single workpiece by edge trimming and surface grinding, and vice versa, before moving on to a second workpiece, and so on and so forth. In the alternative, the apparatus 120 may be configured to process a plurality of workpieces by edge trimming, and thereafter process these same workpieces by surface grinding. In other words, apparatus 120 may be configured to operate in an edge trimming configuration for any number of workpieces in a row and then be changed to operate in a surface grinding operation to process any number of workpieces in a row, and vice versa. Additional configurations of apparatus 120 are herein contemplated and one of ordinary skill in the art would understand and employ additional logistical implementations of the edge trimming and surface grinding capabilities of apparatus 120 to process one or more workpieces.

Embodiments of workpiece processing apparatus 120 and system 203 may comprise, among other components, a home position sensor 100. Home position sensor 100 may be a positioning sensor that is configured on apparatus 120 proximate turntable 2 to sense the relative position of turntable 2 with respect to other components of apparatus 120. A corresponding sensor may be coupled to turntable 2 to assist in the function of sensor 100. In other words, sensor 100 and a turntable sensor may work together to position turntable 2 relative to sensor 100. Also, sensor 100 may be added to apparatus 120 in addition to sensor 10 that is included in apparatus 20, and is described in detail above, or sensor 100 may be an upgraded sensor from that of sensor 10 and thereby replace and supplement the function of sensor 10. In other words, sensor 100 may be configured to function similarly to sensor 20, in that sensor 120 may be able to sense the rotational position of turntable 2 and provide feedback to apparatus 120 to assist apparatus 120 in correctly positioning turntable 2 to accurately position spindles 1*a*, 1*b* and 1*c* with respect to first and second grind spindle 3*a* and 3*b* for surface grinding operation, as described above in discussion of sensor 10. In other words, home position sensor 100 can calibrate and set the "home" location of turntable 2 with respect to the apparatus 120 for surface grinding. Once the "home" position is set, apparatus 120 can base the subsequent movement, or rotation, of turntable 2 off of the position of the "home" location established by the sensor 100.

Yet, sensor 100 may also be configured to sense the rotational position of turntable 2 and provide feedback to apparatus 120 to assist apparatus 120 in correctly positioning turntable 2 to accurately position spindles 1*a*, 1*b* and 1*c* with respect to second grind spindle 3*b* for edge trimming operations. For example, sensor 100 may be adjustable with respect to apparatus 120 or turntable 2. And, sensor 100 may be manually adjusted by a user of apparatus 120 or automatically adjusted by the control systems and software of apparatus 120. Sensor 100 may additionally be adjusted by user input into apparatus 120, which thereafter adjusts sensor 100 according to the user input. Specifically, sensor 100 may be configured to be rotatable, or otherwise adjustable, with respect to apparatus 120 or turntable 2 about the circumference of turntable 2. Sensor 100 may be adjustable from the first position, mentioned above, which is established for surfaced grinding operations, to an adjusted new position that is a circumferential or rotational offset distance 100*a* from the first position about the circumference of turntable 2, the adjusted new position being utilized for edge trimming operations, as discussed below. The adjustable offset distance 100*a* may be any distance suitable for allowing apparatus 120 to perform a corresponding edge trimming operation on a workpiece, depending on such factors as, for example, the size of the workpiece, the amount of edge trimming desired, and the particular apparatus performing the edge trimming. As mentioned, the adjustable circumferential distance of the sensor 100 may be the offset distance 100*a*.

Further in example, the offset distance 100*a* between the original surface grinding position and a new edge trimming position of turntable 2 may be a range of between 0 and 20 mm, depending on the desired edge trimming characteristics to be performed on the particular workpiece on the particular apparatus 120, as suggested above. The offset distance 100*a* can be greater or smaller than this and may be adjustable to any distance within a determined range for the particular apparatus 120 to allow for setting the amount of edge trim desired to be performed on the particular workpiece. For example, should sensor 100 be rotated about 10 mm from the initial position to the new position, sensor 100, working together with turntable 2, can set a new "home" position of turntable 2 that is 10 mm offset from the original home position. The new "home" position can thereafter be utilized by apparatus 120 to apply the desired amount of edge trim to the workpiece that corresponds to the offset distance 100*a* of 10 mm. Indeed, because spindles 1*a*, 1*b* and 1*c* are set on turntable 2 and turntable 2 is now offset the desired and established offset distance 100*a* from its original position, spindles 1*a*, 1*b* and 1*c* are also displaced from their original position under grind spindles 3*a* and 3*b* and are now offset therefrom. Being displaced, or offset, from second grind spindle 3*b* allows apparatus 120 to perform the corresponding edge trimming operations, as depicted in FIG. 4, on the workpiece positioned on spindles 1*a*, 1*b* or 1*c* proximate grind spindle 3*b*. Apparatus 120 may be programmed so that a desired amount of edge trim on a particular workpiece correlates to a particular corresponding offset distance 100*a*, and vice versa. It follows that as the desired amount of edge trim of an individual workpiece changes, so too can the offset distance 100*a* change, or otherwise be adjusted, to match or otherwise accommodate such an amount of edge trim, and vice versa. Embodiments of the apparatus 120 may further comprise first grind spindle 3*a* being disabled, or otherwise not utilized, during edge trimming operations.

In view of the foregoing, sensor 100 can establish the position of spindles 1*a*, 1*b* and 1*c* so that the apparatus 120 can concurrently position one of the three spindles 1*a*, 1*b* and 1*c* to be offset from second grind spindles 3*b* for edge trimming, one of the three spindles 1*a*, 1*b* and 1*c* to be offset from inactive first grind spindle 3*a*, and the remaining third spindle to be asymmetrically positioned between workpiece load transfer arm 104 and workpiece unload transfer arm 105. Indeed, the configuration of workpiece load transfer arm 104 and workpiece unload transfer arm 105 facilitates both the unloading of edge-trimmed workpieces from turntable 2 and the loading of to-be-trimmed workpieces onto the turntable 2, while at the same time permitting second grind spindles 3*b* to concurrently perform edge trimming on the workpiece positioned thereunder.

For example, a method of operating apparatus 120 may be herein described in relation to the functional and structural aspects and operations of components of apparatus 120. Under the condition spindle 1*a* and spindle 1*c* have workpieces placed thereon and the workpiece on spindle 1*c* is being edge-trimmed by second grind spindle 3*b* while the workpiece on spindle 1*a* has been edge-trimmed or is waiting to be so, spindle 1*b* can facilitate unloading and loading of a workpiece therefrom by load transfer arm 104 and unload transfer arm 105. Thereafter, once the workpiece on spindle 1*c* has been satisfactorily edge-trimmed by second grind spindle 3*b*, in accordance with the offset distance 100*a* established by sensor 100, and an edge-trimmed workpiece has been removed from spindle 1*b* and a to-be-edged workpiece is newly inserted onto spindle 1*b*, turntable 2 may axially rotate, spin, or otherwise move in a circular direction, to rotate the spindles 1*a*, 1*b* and 1*c* such that the workpiece on spindle 1*b* can now be edge-trimmed by second grind spindle 3*b* and spindle 1*a* can facilitate unloading of the edge-trimmed workpiece therefrom and loading of a to-be-edged workpiece thereon. Likewise, once the workpiece on spindle 1*b* has been satisfactorily edge trimmed by second grind spindle 3*b* in the amount corresponding to the offset distance 100*a* set by sensor 100, and an edge-trimmed workpiece has been removed from spindle 1*a* and a to-be-edged workpiece is newly inserted onto spindle 1*a*, turntable 2 may axially rotate, spin, or otherwise move in a circular direction, to rotate the spindles 1*a*, 1*b* and 1*c* that the workpiece on spindle 1*a* can now be edge-trimmed by second grind spindle 3*b* and spindle 1*c* can facilitate unloading of the edge-trimmed workpiece therefrom and loading of a to-be-edged workpiece thereon. Such a pattern may be repeated until a satisfactory number of workpieces have been processed by edge trimming. Moreover, embodiments of apparatus 120 may further comprise apparatus 120 incorporating surface grinding operations in sequence with edge trimming operations, as suggested briefly above, such that apparatus 120 may not only edge trim a workpiece, but may also surface grind a workpiece prior to having it removed from the turntable. Such operations and methods may incorporate additional spindles and or grind spindles to effectuate the intended operation.

Further, turntable 2 may be configured to rotate in either or both of a clockwise and counter-clockwise direction of rotation. Such clockwise or counter-clockwise rotation would respectively reverse the sequential interaction of spindles 1a, 1b and 1c with grinding spindle 3b, as well as with load transfer arm 104 and unload transfer arm 105, as necessary.

As suggested above, embodiments of apparatus 120 and system 203 may comprise a gauge 114 positioned proximate grind spindle 3b for measuring the amount of edge trim being applied to a workpiece by grind spindle 3b. Gauge 114 may be configured to measure a thickness (i.e., height or thinness) of the workpiece surface that is being processed or edge trimmed by grind spindle 3b. Specifically, the height (i.e., thinness) of the each of the workpieces can be monitored and measured in situ by gauge 114. Gauge 114 may be a dual probe measurement device, one probe configured to measure the height of the top of the respective spindle 1a, 1b or 1c, and the other probe configured to measure the top of the surface of the edge of the workpiece upon which edge trimming is being performed. The difference between the measurements made by each probe of the respective dual probe gauge 14 is the thinness of the respective workpiece.

Embodiments of the apparatus 120 may further comprise the dual probe gauge 14 being configured to measure in situ a radial width of the edge portion of the workpiece upon which the edge trimming operation is being performed. One probe of the dual probe gauge 14 may be configured to measure the radial distance from the center of the workpiece to the beginning or initial edge of the edge-trimmed portion of the workpiece, whereas the second probe of the dual probe gauge 14 may be configured to measure the radial distance from the center of the workpiece to the outer edge of the workpiece. The difference between the measurements made by each probe of the respective dual probe gauge 14 is the radial width of the edge-trimmed portion, or the amount of edge trim, of the respective workpiece. In this way, the amount of edge trim being applied to an individual workpiece may be verified by gauge 114. Thereafter, any changes to the offset distance 100a, and thus the relative position of sensor 100, may be made by apparatus 120 or by a user of apparatus 120 to achieve the correct or desired amount of edge trim on any one workpiece or a series of workpieces that corresponds to the offset distance 100a. Embodiments of apparatus 120 may further comprise gauge 114 measuring in situ the amount of edge trim and thereby directing apparatus 120 to apply changes in real time to the offset distance 100a and sensor 100 to correct the amount of edge trim.

Embodiments of apparatus 120 and system 203 may further comprise unload transfer arm 105 and load transfer arm 104 being configured to radially extend and/or refract, as needed and directed, to remove workpieces from or add workpieces to, respectively, turntable 2 in the edge trimming operational configuration. Because the transition of the sensor 100 to the new "home" position for edge trimming requires turntable 2 to establish an offset distance 100a different from the "home" position for surface grinding, and because the spindles 1a, 1b and 1c are spaced apart a predetermined fixed circumferential distance from one another on turntable 2, the spindles 1a, 1b and 1c cannot be positioned in a load/unload workpiece transfer station 3c that is symmetrical between unload transfer arm 105 and load transfer arm 104. Instead, as depicted in FIG. 4, spindles 1a, 1b or 1c, for purposes of unloading and loading workpieces, are sequentially positioned asymmetrically between unload transfer arm 105 and load transfer arm 104. Accordingly, the normal symmetric rotation of unload transfer arm 105 and load transfer arm 104 about their respective axes, as described above with respect to apparatus 20, and as depicted in FIG. 1, cannot result in the vacuum end of transfer arms 105 and 104 being positioned over the asymmetrically positioned spindle of spindles 1a, 1b or 1c to remove therefrom or add thereto a workpiece.

To achieve such an asymmetrical result, embodiments of apparatus 120 may be configured to have unload transfer arm 105 and load transfer arm 104 extend to position their respective vacuum ends over the spindle in question. For example, unload transfer arm 105 may further comprise a rotational position sensor 103 that is in functional communication with unload transfer arm 105 to sense the rotational position of unload transfer arm 105 as it rotates through its range of motion during its intended operation of removing processed workpieces from spindles 1a, 1b and 1c of turntable 2. Further in example, load transfer arm 104 may further comprise a rotational position sensor 102 that is in functional communication with load transfer arm 104 to sense the rotational position of load transfer arm 104 as it rotates through its range of motion during its intended operation of loading new workpieces onto spindles 1a, 1b and 1c of turntable 2. Some of the axial rotational characteristics of unload transfer arm 105 and load transfer arm 104 may be similar in operation to that of unload transfer arm 5 and load transfer arm 4 described above. For example, unload transfer arm 105 and load transfer arm 104 may rotate about the same axes, respectively, as that of unload transfer arm 5 and load transfer arm 4. However, unload transfer arm 105 and load transfer arm 104 may further comprise a position indicator 105a and 104a, respectively, whereby should unload transfer arm 105 rotate in its usual rotation pattern over position indicator 105a, or, similarly, should load transfer arm 104 rotate in its usual rotation pattern over position indicator 104a, position sensors 103 and 102, respectively, may instruct unload transfer arm 105 and load transfer arm 104 to extend or retract as described herein.

Embodiments of apparatus 120 and system 203 may further comprise unload transfer arm 105 and load transfer arm 104 each being configured with means for extending and/or refracting the vacuum end of each of unload transfer arm 105 and load transfer arm 104 between the symmetrical position (i.e., surface grinding) and the asymmetrical position (i.e., edge trimming). For example, each of unload transfer arm 105 and load transfer arm 104 may further comprise an actuator that extends unload transfer arm 105 and load transfer arm 104 to increase its respective radial length to the asymmetrical position. Likewise, this same actuator, or an additional actuator, may retract unload transfer arm 105 and load transfer arm 104 to reduce its respective radial length back to the symmetric position. The actuator may function with an extension mechanism to extend the radial length of unload transfer arm 105 and load transfer arm 104. The extension mechanism may be a slide mechanism that is actuated by electric, pneumatic, magnetic, or hydraulic power, and the like. In certain embodiments, the extension mechanism may be a pneumatically actuated slide mechanism. Other known actuators may be known and implemented by those of ordinary skill in the art to implement the transition of unload transfer arm 105 and load transfer arm 104 between their respective symmetric and asymmetric lengths.

For example, a system 203 and method of operating apparatus 120 to unload and load workpieces thereon to be processed by apparatus 120 may be described herein with relation to the functional and structural aspects of the particular components of apparatus 120. To unload a processed workpiece from one of spindles 1a, 1b or 1c in an edge-trimming configuration, workpiece unload transfer arm 105 may be utilized. After a workpiece has undergone edge trimming, according to the discussion above, workpiece unload transfer arm 105 rotates, or otherwise spins about its axis, from parked position 8 to a position over the edge-trimmed workpiece that is positioned asymmetrically between unload transfer arm 105 and load transfer arm 104. However, to be properly positioned, unload transfer arm 105 may have to be extended to be properly positioned over the workpiece. To accomplish this, as unload transfer arm 105 passes over or rotates through position indicator 105a, sensor 103 senses that position indicator 105a has been passed over or rotated through, at which time sensor 103 instructs actuator on unload transfer arm 105 to extend the extension mechanism to increase the radial length of unload transfer arm 105 to a length that corresponds with the offset distance 100a set by the sensor 100 to properly position and center the vacuum end over the workpiece to be removed, as depicted in FIG. 4. Indeed, unload transfer arm 105 may further comprise an adjustable extension stop position that corresponds to the length needed for the vacuum end of unload transfer arm 105 to be centered above the workpiece to be removed on the asymmetrically positioned spindle 1a, 1b or 1c. Embodiments of apparatus 120 may further comprise the adjustable extension stop position described above being configured to change to adjust to the corresponding offset distance 100a established by sensor 100. In this way, the adjustable extension stop position accounts for the differing extension lengths of unload transfer arm 105 corresponding to the differing rotational position of spindles 1a, 1b or 1c based on the amount of edge trim selected by adjusting the sensor 100. In other words, the parameter selected for the amount of edge trim by the sensor 100 may have a corresponding parameter for the length of the adjustable extension stop position needed to place the vacuum end of the unload transfer arm 105 over the asymmetrical spindle position during edge trimming.

Once centered over the edge-trimmed workpiece, unload transfer arm 105 is lowered onto the edge-trimmed workpiece so that a vacuum cup configured on unload transfer arm 105 is positioned over the edge-trimmed workpiece. A vacuum force is applied from unload transfer arm 105 to the edge-trimmed workpiece, such that unload transfer arm 105 functionally engages the edge-trimmed workpiece. Once unload transfer arm 105 determines it has engaged the edge-trimmed workpiece, the opposing vacuum force of the associated spindle 1a, 1b or 1c is disabled to allow unload transfer arm 105 to lift the edge-trimmed workpiece off of the spindle 1a, 1b or 1c. With the edge-trimmed workpiece coupled thereto, unload transfer arm 105 rotates back through position indicator 105a. As unload transfer arm 105 passes over or rotates through position indicator 105a, sensor 103 senses that position indicator 105a has been passed over or rotated through, at which time sensor 103 instructs actuator on unload transfer arm 105 to retract the extension mechanism to decrease the radial length of unload transfer arm 105 to a length that corresponds with the normal symmetric length utilized in surface grinding operations, as depicted in FIG. 4. In this way, once unload transfer arm 105 is retracted to its normal symmetric length, unload transfer arm 105 may subsequently operate similarly to unload transfer arm 5 described above. Indeed, unload transfer arm 105 may rotate by its parked position 8 to a spinner table 9, upon which the unload transfer arm 105 places the edge-trimmed workpiece. Unload transfer arm 105 thereafter rotates back to parked position 8 to await further instruction. Dashed lines indicate the path 105b and 105b' traveled by the unload transfer arm 105 in the performance of its function. As depicted in FIG. 4, path 105b may be the exemplary rotational path of the unextended unload transfer arm 105, whereas path 105b' may be the exemplary rotational path of the extended unload transfer arm 105.

To load a new, or to-be-edge-trimmed, workpiece on asymmetrically positioned spindle 1a, 1b, or 1c, workpiece load transfer arm 4 may be utilized. Load transfer arm 104 may be configured to rotate, or otherwise spin about an axis, from parked position 7 to workpiece positioning table 6 that holds new workpieces to be edge-trimmed, much like load transfer arm 4. Once centered over the workpiece positioning table 6, load transfer arm 104 is lowered onto the new workpiece so that a vacuum cup configured on the distal end of load transfer arm 104 is positioned over the new workpiece and in proximity to the new workpiece. A vacuum force is applied from load transfer arm 104 to the new workpiece, such that load transfer arm 104 functionally engages the new workpiece. Once load transfer arm 104 determines it has engaged the new workpiece by vacuum force, load transfer arm 104 lifts the new workpiece off of workpiece positioning table 6. With the new workpiece coupled thereto, load transfer arm 104 rotates back to its parked position 7. At parked position 7, a workpiece washing station 7a can wash the new workpiece prior to the new workpiece being inserted onto empty, asymmetrically positioned spindle 1a, 1b or 1c. Once washed, load transfer arm 104 rotates, or otherwise spins, about its axis, from parked position 7 to a position over empty spindle 1a, 1b or 1c that is positioned asymmetrically between unload transfer arm 105 and load transfer arm 104. However, to be properly positioned, load transfer arm 104 may have to be extended to be properly positioned over the asymmetrical spindle 1a, 1b or 1c.

To accomplish this, as load transfer arm 104 passes over or rotates through position indicator 104a, sensor 102 senses that position indicator 104a has been passed over or rotated through, at which time sensor 102 instructs actuator on load transfer arm 104 to extend its extension mechanism to increase the radial length of load transfer arm 104 to a length that corresponds with the offset distance 100a set by the sensor 100 to properly position and center the vacuum end of load transfer arm 104, having the new workpiece coupled thereto, over the empty spindle 1a, 1b or 1c, as depicted in FIG. 4. Indeed, load transfer arm 104 may further comprise an adjustable extension stop position that corresponds to the length needed for the vacuum end of load transfer arm 104 to be centered above the asymmetrically positioned spindle 1a, 1b or 1c. Embodiments of apparatus 120 may further comprise the adjustable extension stop position described above being configured to change to adjust to the corresponding offset distance 100a established by sensor 100. In this way, the adjustable extension stop position accounts for the differing extension lengths of load transfer arm 104 corresponding to the differing rotational position of spindles 1a, 1b or 1c based on the amount of edge trim selected by adjusting the sensor 100. In other words, the parameter selected for the amount of edge trim by the sensor 100 may have a corresponding parameter for the length of the adjustable extension stop position needed to place the vacuum end of the load transfer arm 104 over the asymmetrical spindle position during edge trimming operations.

Once centered over empty asymmetrically positioned spindle 1a, 1b or 1c, as described above, load transfer arm 104 lowers the new workpiece onto empty spindle 1a, 1b or 1c. After the new workpiece is positioned on spindle 1a, 1b or 1c, spindle 1a, 1b or 1c applies vacuum force to the new workpiece to secure the new workpiece thereon. Once spindle 1a, 1b or 1c determines it has the new workpiece secured, the opposing vacuum force from load transfer arm 104 is disabled, leaving the new workpiece on spindle 1a, 1b or 1c.

Load transfer arm 104 thereafter rotates back to parked position 6, but passes over or back through position indicator 104a. As load transfer arm 104 passes over or rotates through position indicator 104a on its way to parked position 6, sensor 102 senses that position indicator 104a has been passed over or rotated through, at which time sensor 102 instructs actuator on load transfer arm 104 to retract the extension mechanism to decrease the radial length of load transfer arm 104 to a length that corresponds with the normal symmetric length utilized in surface grinding operations, as depicted in FIG. 4. In this way, once load transfer arm 104 is retracted to its normal symmetric length, load transfer arm 104 may return to parked position 7 and wait for further instructions. Dashed lines indicate the path 104b and 104b' traveled by the load transfer arm 104 in the performance of its function. As depicted in FIG. 4, path 104b may be the exemplary rotational path of the unextended unload transfer arm 104, whereas path 104b' may be the exemplary rotational path of the extended unload transfer arm 104. Moreover, in apparatus 120, load/unload transfer station 3c may be positioned asymmetrically between unload transfer arm 5 and load transfer arm 4, as discussed herein. And, the position of load/transfer station 3c may be positioned at the intersection of the paths 105b' and 104b'. Or, alternatively, the lengths of transfer arms 4 and 5 may be extended the requisite length, as described herein, such that the intersection of the paths 105b' and 104b' is over the position of load/transfer station 3c.

In edge-trimming operations, spindle cleaning brush 12 and spindle dresser 13 can be utilized to perform the cleaning and preparation of empty spindle 1a, 1b, or 1c for reception of the new workpiece. However, their associated position parameters would necessarily need to be adjusted to account for the asymmetrical position of the spindles 1a, 1b or 1c. The associated positional parameters of spindle cleaning brush 12 and spindle dresser 13 can be adjusted for use with apparatus 120 by amending the operational software and hardware of apparatus 20. In some embodiments of apparatus 120, during edge-trimming operations, workpiece cleaning brush 11 may not be utilized. However, in other embodiments of apparatus 120, workpiece cleaning brush 11 may be implemented by amending the positional parameters to account for the asymmetrical position of the spindles 1a, 1b and 1c.

Figure 5:
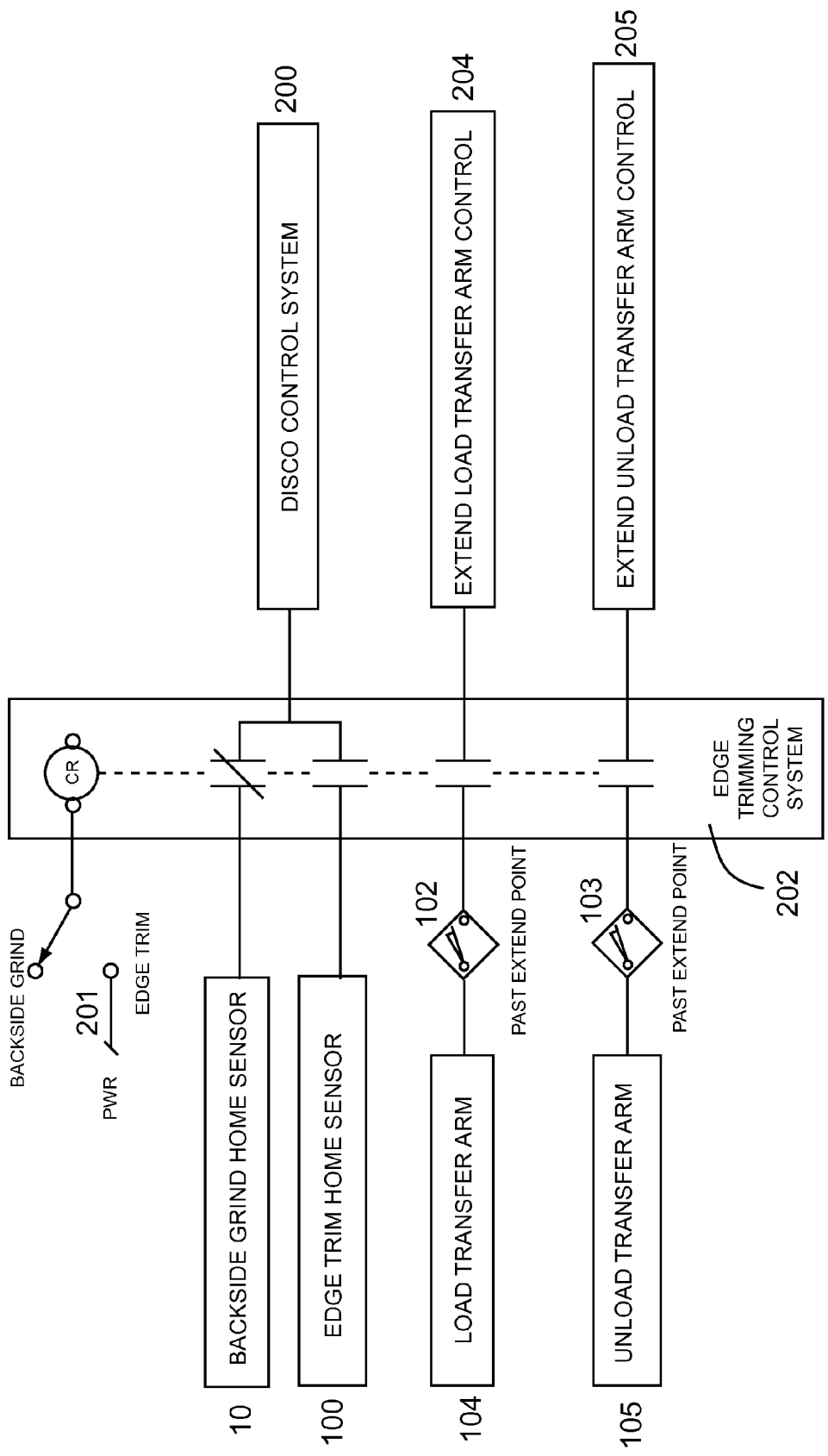
FIG. 5 is a schematic view of a surface grinding configuration of an embodiment of a workpiece surface grinding and edge trimming apparatus in accordance with the present disclosure.

With reference now to FIG. 5, as part of system 203, apparatus 120 may further comprise an edge trimming control system 202 that includes an edge trim selector 201. Edge trimming control system 202 may monitor the state of apparatus 120 and control the operational aspects of apparatus 120, and in particular can control the transition of apparatus 120 back and forth between a surface grinding state and an edge trimming state based on the state of edge trim selector 201. Edge trimming control system 202 may control and instruct the associated operations of apparatus 120 in either the surface grinding state or the edge trimming state.

As depicted in FIG. 5, under the condition that edge trim selector 201 is not triggered or selected, apparatus is set to operate in a surface grinding configuration logic state. In the surface grinding logic state, power is supplied from the DISCO® control system 200 to sensor 10, as indicated by the slashed line between vertical lines, to instruct sensor 10 to establish a "home" position for turntable 2 for surface grinding operations as described above. Alternatively, under the condition that sensor 100 replaces sensor 10 and performs its intended function, power may be supplied to sensor 100 to instruct sensor 100 to establish a "home" position for turntable 2 for surface grinding operations as described above. Also, in the surface grinding configuration, power and control of the extension mechanism in each of transfer arms 105 and 104 is disabled, such that transfer arms 105 and 104 operate similarly to, or even exactly like, transfer arms 5 and 4, respectively. Accordingly, transfer arms 105 and 104 are not configured to extend their radial length, but instead are configured to maintain their fixed length as they rotate about their respective axes to remove and insert workpieces on one of spindles 1a, 1b or 1c positioned symmetrically between transfer arms 105 and 104 (described in detail above with respect to transfer arms 5 and 4 and the symmetrical position of spindles 1a, 1b and 1c).

Figure 6:
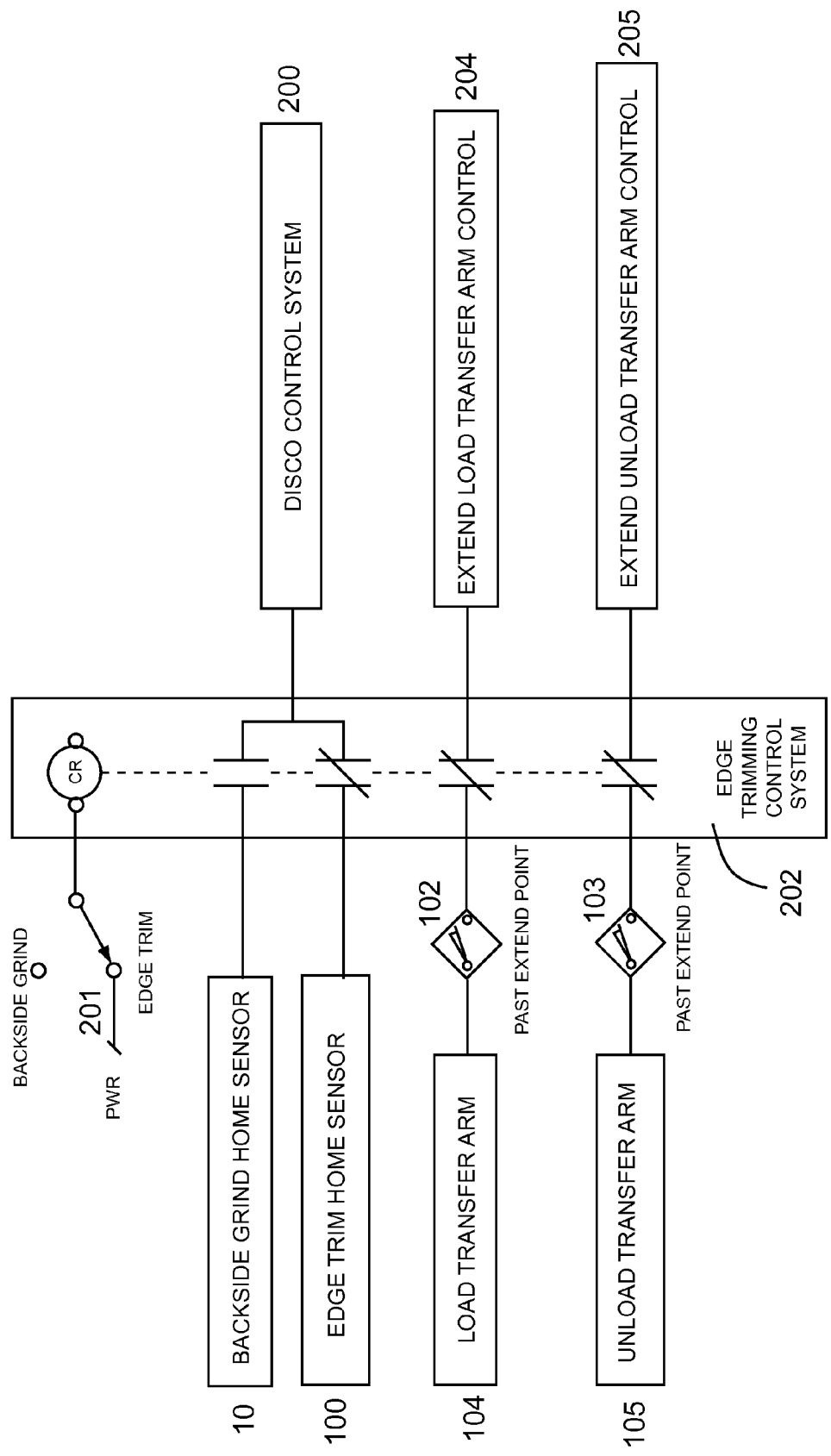
FIG. 6 is a schematic view of an edge trimming configuration of an embodiment of a workpiece surface grinding and edge trimming apparatus in accordance with the present disclosure.

As depicted in FIG. 6, under the condition that edge trim selector 201 is triggered or selected, apparatus is set to operate in an edge-trimming configuration logic state. In the edge-trimming logic state, power is supplied from the DISCO® control system 200 to sensor 100, as indicated by the slashed line between vertical lines, to instruct sensor 100 to establish an adjusted, or offset, "home" position for turntable 2 for edge-trimming operations as described above. Also, in the edge-trimming configuration, power and control of the extension mechanism in each of transfer arms 105 and 104 is activated, such that power can be supplied, as indicated by the slashed line between vertical lines, to the extension mechanisms in transfer arms 105 and 104, under the appropriate conditions. With power supplied to the extension mechanism in transfer arms 105 and 104, once sensors 103 and 102 sense that transfer arms 105 and 104 have rotated over or through position indicators 105a and 104a, respectively, on their way to one of spindles 1a, 1b or 1c, power is supplied to extension mechanisms in transfer arms 105 and 104 to extend the length of transfer arms 105 and 104 to the predetermined length that corresponds with the offset distance 100a, or the amount of offset, established by sensor 100 for the amount of edge trimming desired on the particular workpiece. The extension length of each of the transfer arms 105 and 104 may be different from one another for each offset distance 100a determined by sensor 100. On the other hand, once sensors 103 and 102 sense that transfer arms 105 and 104 have rotated over or through position indicators 105a and 104a, respectively, on their way back from one of spindles 1a, 1b or 1c, power is cut off from extension mechanisms in transfer arms 105 and 104 to automatically retract the length of transfer arms 105 and 104 to the fixed length that is utilized in surface grinding operations. The rotational position of transfer arms 105 and 104, as well as the rotational position of position indicators 105a and 104a may be set within the DISCO® control system 200 via the DISCO® control interface. Moreover, the parameter selected for the amount of edge trim, or offset distance 100a, by the sensor 100 may have a corresponding parameter for the length of the adjustable extension stop position needed to place each of the distal ends of transfer arms 105 and 104 over the asymmetrical spindle position during edge trimming. Again, the length of the adjustable extension stop for each of the transfer arms 105 and 104 may be different from one another for each offset distance 100a determined by sensor 100. Nevertheless, these corresponding parameters may be calculated and known prior to operation of apparatus 120 and may be inserted into DISCO® control system 200 via the DISCO® control interface.

Embodiments of apparatus 120 and system may comprise sensor 100, transfer arms 105 and 104, sensors 102 and 103, gauge 114, edge trimming control system 202 and edge trim selector 201, in addition to other hardware and control parameters that permit apparatus 120 to perform both surface grinding and edge trimming of workpieces, being implemented onto an existing rotary turntable architecture, such as apparatus 20, depicted in FIG. 1, to convert a surface grinding apparatus, such as apparatus 20, into an apparatus 120 and system 203, capable of performing both surface grinding and edge trimming of workpieces on a single machine, as described in more detail above. Alternatively, embodiments of apparatus 120 and system 203 may be incorporated directly into the operating software and hardware of a single machine manufactured for the purpose of performing both surface grinding and edge trimming of workpieces on a single machine. Such implementation can be incorporated at the manufacturing level, but such implementation is considered by the present disclosure.

For example, embodiments of apparatus 120 may further comprise software being written and programmed to effectuate the function and result of the apparatus 120, as described above. Portions of the software may include the apparatus 120 being directed to rotate turntable 2 to accurately position itself, and reposition itself, for each individual function performed by apparatus 120, as described herein. For example, software may direct turntable 2 to be rotated and positioned at a specific location, such as the first position, with respect to apparatus 120 to effectuate surface grinding of workpieces. Further, software may direct turntable 2 to thereafter be rotated and repositioned at another specific location, such as the offset position, with respect to apparatus 120 to effectuate edge trimming of a workpiece. The order of performing surface grinding and edge trimming may be controlled and switched as needed by the software. Further, software may direct turntable 2 to thereafter be rotated and repositioned at still another specific location with respect to apparatus 120, such as in the path 105b, to effectuate removal of a processed workpiece from turntable 2 by the unextended unload transfer arm 105 along path 105b. Further, software may direct turntable 2 to thereafter be rotated and repositioned at still another specific location with respect to apparatus 120, such as path 104b, to effectuate insertion of a new workpiece from turntable 2 by the unextended load transfer arm 104 along path 104b. The order of removing a processed workpiece from turntable 2 and inserting a new workpiece onto turntable 2 may be controlled and switched as needed by the software. In this way, with turntable 2 repositioning itself, and thus the spindles 1a, 1b and 1c, between each individual process step of apparatus 120, apparatus 120 may perform the necessary steps of edge trimming, surface grinding, workpiece removal, and workpiece insertion, all without having to extend or retract unload transfer arm 105 or load transfer arm 104. Such software programming at the manufacturer level or reprogramming at the consumer level may therefore eliminate the need for the structure and function of apparatus 120 as it relates to the extension and retraction of unload transfer arm 105 or load transfer arm 104. Indeed, instead of having unload transfer arm 105 or load transfer arm 104 extend and retract, as needed, to reposition their respective distal ends over spindles 1a, 1b or 1c and workpieces thereon, the software may rotate turntable 2 to place the spindle in question in the desired location to be reached and communicate with the respective unload transfer arm 105, load transfer arm 104, and grind spindle 3a or 3b. Other components of apparatus 120 described herein may function according to their respective operations described above, so long as they concur with the software-controlled operation of apparatus 120. For example, the vacuum feature of transfer arms 104 and 105 may operate according to the disclosure herein, even when the programmed software controls the rotation of turntable 2 to effectuate the respective positioning of spindles 1a, 1b and 1c with respect to transfer arms 104 and 105 to remove and insert workpieces.

While this disclosure has been described in conjunction with the specific embodiments outlined above, it is evident that many alternatives, modifications and variations will be apparent to those skilled in the art. Accordingly, the preferred embodiments of the present disclosure as set forth above are intended to be illustrative, not limiting. Various changes may be made without departing from the spirit and scope of the present disclosure, as required by the following claims. The claims provide the scope of the coverage of the present disclosure and should not be limited to the specific examples provided herein.

What is claimed is:

1. A workpiece processing apparatus, the apparatus comprising:
   a rotary turntable configured to rotate about a turntable axis;
   a workpiece spindle on the turntable, the workpiece spindle being configured to secure a workpiece thereon, the workpiece spindle being configured to rotate about a workpiece spindle axis independently of the rotation of the turntable; and
   a grind spindle, the grind spindle being configured to overlay the turntable and functionally engage the workpiece when rotated thereunder;
   wherein the apparatus is configured to transition between a first operational state and a second operational state, and
   wherein in the first operational state the turntable is configured in a first position to center the workpiece spindle and the workpiece thereon under the grind spindle so that the grind spindle may condition an entire front surface of the workpiece, and
   wherein in the second operational state the turntable is in the same position as in the first operational state and wherein the grind spindle is linearly moved perpendicular to its grind spindle axis, wherein position between the turntable axis and the grind spindle axis is changed to offset the grind spindle and the workpiece.

2. The apparatus of claim 1, further comprising:
   a first sensor fixed relative to the apparatus and configured to position the turntable in the first position for surface grinding of the workpiece in the first operational state; and
   a second sensor adjustable relative to the apparatus and configured to rotate about the turntable to adjust and set the offset distance of the turntable from the first position that correlates to an amount of edge trimming of the workpiece in the second operational state.

3. The apparatus of claim 1, further comprising:
   an unload transfer arm proximate the turntable configured to remove the workpiece from the workpiece spindle of the turntable;
   a load transfer arm proximate the turntable configured to insert a new workpiece on the workpiece spindle of the turntable; and
   a workpiece transfer station, the workpiece transfer station being defined by the workpiece spindle on the turntable being temporarily positioned between the unload transfer arm and the load transfer arm,
   wherein each of the unload transfer arm and the load transfer arm is configured to rotate about a respective axis such that respective ends of the transfer arms create resulting arc paths, the resulting arc paths intersecting at the workpiece transfer station to facilitate removal and insertion of workpieces.

4. The apparatus of claim 3,
   wherein in the first operational state the workpiece transfer station is positioned symmetrically between the unload transfer arm and the load transfer arm such that an operational length of each of the unload transfer arm and the load transfer arm is fixed along respective arc paths, and wherein in the second operational state the workpiece transfer station is positioned asymmetrically between the unload transfer arm and the load transfer arm such that an operational length of each of the unload transfer arm and the load transfer arm is independently adjustable along respective arc paths to account for the asymmetric position of the workpiece transfer station.

5. The apparatus of claim 4, further comprising:
an unload transfer arm sensor configured to sense a position of the unload transfer arm, wherein under the condition the apparatus is in the second operational state and the unload transfer arm rotates toward the workpiece transfer station and passes a predetermined point along the arc path, the unload transfer arm sensor instructs the unload transfer arm to extend its length a predetermined distance that correlates to the offset distance to permit the end of the unload transfer arm to reach the workpiece transfer station, and wherein under the condition the apparatus is in the second operational state and the unload transfer arm rotates away from the workpiece transfer station and passes back over the predetermined point along the arc path, the unload transfer arm sensor instructs the unload transfer arm to retract its extended length; and
a load transfer arm sensor configured to sense a position of the load transfer arm, wherein under the condition the apparatus is in the second operational state and the load transfer arm rotates toward the workpiece transfer station and passes a predetermined point along the arc path, the load transfer arm sensor instructs the load transfer arm to extend its length a predetermined distance that correlates to the offset distance to permit the end of the load transfer arm to reach the workpiece transfer station, and wherein under the condition the apparatus is in the second operational state and the load transfer arm rotates away from the workpiece transfer station and passes back over the predetermined point along the arc path, the load transfer arm sensor instructs the load transfer arm to retract its extended length.

6. The apparatus of claim 1, further comprising:
an edge trimming gauge proximate the turntable and configured to measure and monitor an amount of edge trim being applied by the grind spindle to the perimeter edge of the workpiece during edge trimming.

7. The apparatus of claim 1, further comprising:
a plurality of workpiece spindles on a perimeter of the turntable, each of the workpiece spindles being configured to secure a workpiece thereon and spaced apart a circumferential distance from one another; and
a plurality of grind spindles configured to overlay the turntable and functionally engage the workpieces when rotated thereunder by the intermittent rotary movement of the turntable,
wherein in the first operational state the turntable is in the first position and is configured to intermittently rotate the circumferential distance to sequentially center a workpiece spindle of the plurality of workpiece spindles under each of the plurality of grind spindles to permit the grind spindles to condition entire front surfaces of the respective workpieces sequentially centered thereunder, and
wherein in the second operational state the turntable is in the same position as in the first operational state and wherein one of the plurality of grind spindles is linearly moved perpendicular to its grind spindle axis, wherein position between the turntable axis and the grind spindle axis is changed to offset the one of the plurality of grind spindles and the workpiece.

8. The apparatus of claim 7, further comprising:
a first sensor fixed relative to the apparatus and configured to position the turntable in the first position for surface grinding of the workpieces in the first operational state; and
a second sensor adjustable relative to the apparatus and configured to rotate about the turntable to adjust and set the offset distance of the turntable from the first position for the amount of edge trimming of workpieces in the second operational state.

9. The apparatus of claim 7, further comprising:
an edge trimming gauge proximate the turntable and configured to measure and monitor the amount of edge trim being applied by the one of the plurality of grind spindles to the perimeter edge of the one of the workpieces.

10. The apparatus of claim 7, further comprising:
an unload transfer arm proximate the turntable configured to remove processed workpieces from the workpiece spindles of the turntable;
a load transfer arm proximate the turntable configured to insert new workpieces on the spindles of the turntable; and
a workpiece transfer station, the workpiece transfer station being defined by a spindle on the turntable temporarily positioned between the unload transfer arm and the load transfer arm,
wherein each of the unload transfer arm and the load transfer arm are configured to rotate about a respective axis such that respective ends of the transfer arms create resulting arc paths, the resulting arc paths intersecting at the workpiece transfer station to facilitate removal and insertion of workpieces.

11. The apparatus of claim 10,
wherein in the first operational state the workpiece transfer station is positioned symmetrically between the unload transfer arm and the load transfer arm such that an operational length of each of the unload transfer arm and the load transfer arm is fixed along respective arc paths, and
wherein in the second operational state the workpiece transfer station is positioned asymmetrically between the unload transfer arm and the load transfer arm such that an operational length of each of the unload transfer arm and the load transfer arm is independently adjustable along respective arc paths to account for the asymmetric position of the workpiece transfer station.

12. The apparatus of claim 11, further comprising:
an unload transfer arm sensor configured to sense a position of the unload transfer arm, wherein under the condition the apparatus is in the second operational state and the unload transfer arm rotates toward the workpiece transfer station and passes a predetermined point along the arc path, the unload transfer arm sensor instructs the unload transfer arm to extend its length a predetermined distance that correlates to the offset distance to permit the end of the unload transfer arm to reach the workpiece transfer station, and wherein under the condition the apparatus is in the second operational state and the unload transfer arm rotates away from the workpiece transfer station and passes back over the predetermined point along the arc path, the unload transfer arm sensor instructs the unload transfer arm to retract its extended length; and
a load transfer arm sensor configured to sense a position of the load transfer arm, wherein under the condition the apparatus is in the second operational state and the load transfer arm rotates toward the workpiece transfer station and passes a predetermined point along the arc path, the load transfer arm sensor instructs the load transfer arm to extend its length a predetermined distance that correlates to the offset distance to permit the end of the load transfer arm to reach the workpiece transfer station, and wherein under the condition the apparatus is in the second operational state and the load transfer arm rotates away from the workpiece transfer station and passes back over the predetermined point along the arc path, the load transfer arm sensor instructs the load transfer arm to retract its extended length.

13. A system for enabling a workpiece front surface grinding apparatus to perform surface grinding and edge trimming of workpieces, the system comprising:
a rotary turntable configured on the apparatus to rotate about a turntable axis, the turntable having a home position corresponding to a surface grinding configuration;
a plurality of workpiece spindles on a perimeter of the turntable, each of the workpiece spindles being spaced apart a circumferential distance from one another and configured to secure a workpiece thereon; and
a plurality of grind spindles configured to overlay the turntable and functionally engage the workpieces when rotated thereunder by the intermittent rotary movement of the turntable, wherein the plurality of grind spindles linearly translate perpendicular to their axes;
a sensor on the apparatus that positions the turntable, the sensor being configured to rotate an offset distance circumferentially about the turntable to reposition the home position of the turntable to an edge trimming position for an edge trimming configuration, the offset distance relating to an amount of edge trim to be applied to the workpieces; and
a controller in communication with the apparatus to selectively direct the apparatus to operate in the edge trimming configuration.

14. The system of claim 13, further comprising:
an unload transfer arm proximate the turntable configured to remove processed workpieces from the workpiece spindles of the turntable;
a load transfer arm proximate the turntable configured to insert new workpieces on the workpiece spindles of the turntable; and
a workpiece transfer station, the workpiece transfer station being defined by the workpiece spindle on the turntable temporarily positioned between the unload transfer arm and the load transfer arm,
wherein each of the unload transfer arm and the load transfer arm are configured to rotate about a respective axis such that respective ends of the transfer arms create resulting arc paths, the resulting arc paths intersecting at the workpiece transfer station to facilitate removal and insertion of workpieces,
wherein in the surface grinding configuration the home position of the turntable positions the workpiece transfer station symmetrically between the unload transfer arm and the load transfer arm, such that an operational length of each of the unload transfer arm and the load transfer arm is fixed along respective arc paths that intersect at the workpiece transfer station, and
wherein in the edge trimming configuration the offset position of the turntable positions the workpiece transfer station asymmetrically between the unload transfer arm and the load transfer arm, and the controller controls an operational length of each of the unload transfer arm and the load transfer arm to independently adjust to account for the asymmetric position of the workpiece transfer station.

15. The system of claim 14, further comprising:
an unload transfer arm sensor in functional communication with the unload transfer arm to sense a position of the unload transfer arm, wherein in the surface grinding configuration the controller deactivates the unload transfer arm sensor, and wherein in the edge trimming configuration the controller activates the unload transfer arm sensor; and
a load transfer arm sensor in functional communication with the load transfer arm to sense a position of the load transfer arm, wherein in the surface grinding configuration the controller deactivates the load transfer arm sensor, and wherein in the edge trimming configuration the controller activates the unload transfer arm sensor.

16. The system of claim 15,
wherein under the condition the unload transfer arm sensor is active and the unload transfer arm rotates toward the workpiece transfer station and passes a predetermined point along its arc path, the controller instructs the unload transfer arm to extend its length a predetermined distance that correlates to the offset distance to permit the end of the unload transfer arm to reach the workpiece transfer station, and wherein under the condition the unload transfer arm rotates away from the workpiece transfer station and passes back over the predetermined point along the arc path the controller instructs the unload transfer arm to retract its extended length, and
wherein under the condition the load transfer arm sensor is active and the load transfer arm rotates toward the workpiece transfer station and passes a predetermined point along its arc path, the load transfer arm sensor instructs the load transfer arm to extend its length a predetermined distance that correlates to the offset distance to permit the end of the load transfer arm to reach the workpiece transfer station, and wherein under the condition the load transfer arm rotates away from the workpiece transfer station and passes back over the predetermined point along the arc path the load transfer arm sensor instructs the load transfer arm to retract its extended length.

17. A method for processing workpieces on a front surface grinding apparatus configured to additionally perform edge trimming, the method comprising:
inserting a workpiece on at least one of a plurality of workpiece spindles on a turntable of the apparatus;
adjusting the turntable a selected offset distance to offset the plurality of workpiece spindles from grind spindles overlaying the turntable;
rotating the turntable to bring the workpiece in proximity to one of the grind spindles such that the grind spindle partially overlays the workpiece due to the offset distance;
trimming an edge of the workpiece with the one of the grind spindles; and
removing the workpiece from the turntable, wherein the one of the grind spindles linearly translates perpendicular to its axis.

18. The method of claim 17, wherein the inserting the workpiece further comprises:
rotating a load transfer arm toward a workpiece;
picking up the workpiece with the load transfer arm;
rotating the load transfer arm toward the turntable;

extending a length of the load transfer arm a predetermined distance that correlates with the selected offset distance to position the workpiece over the at least one of a plurality of spindles;

releasing the workpiece from the load transfer arm;

rotating the load transfer arm away from the turntable; and retracting the load transfer arm the predetermined distance.

19. The method of claim 17, wherein the removing the workpiece further comprises:

rotating an unload transfer arm toward a processed workpiece on the at least one of a plurality of workpiece spindles;

extending a length of the unload transfer arm a predetermined distance that correlates with the selected offset distance to position the unload transfer arm over the processed workpiece;

picking up the processed workpiece with the unload transfer arm;

rotating the unload transfer arm away from the turntable;

retracting the load transfer arm the predetermined distance; and releasing the processed workpiece from the unload transfer arm.

20. The method of claim 17, wherein the adjusting the turntable further comprises:

moving a home positioning sensor circumferentially about the turntable to reconfigure a home position of the turntable for edge trimming.

\* \* \* \* \*